(12) United States Patent
Nemouchi

(10) Patent No.: US 7,842,612 B2
(45) Date of Patent: Nov. 30, 2010

(54) SELECTIVE FORMATION OF A COMPOUND COMPRISING A SEMI-CONDUCTING MATERIAL AND A METALLIC MATERIAL IN A SUBSTRATE THROUGH A GERMANIUM OXIDE LAYER

(75) Inventor: Fabrice Nemouchi, Moirans (FR)

(73) Assignee: Commissariat a l'Energie Atomique, Paris (FR)

( * ) Notice: Subject to any disclaimer, the term of this patent is extended or adjusted under 35 U.S.C. 154(b) by 299 days.

(21) Appl. No.: 12/285,068

(22) Filed: Sep. 29, 2008

(65) Prior Publication Data

US 2009/0087985 A1   Apr. 2, 2009

(30) Foreign Application Priority Data

Oct. 2, 2007   (FR) .................................. 07 06902

(51) Int. Cl.
*H01L 21/336* (2006.01)
(52) U.S. Cl. .................................. 438/677; 257/E21.44
(58) Field of Classification Search .......... 257/E21.156, 257/E21.438, E21.439, E21.44; 438/674, 438/677, 682, 683
See application file for complete search history.

(56) References Cited

U.S. PATENT DOCUMENTS 6,399,467 B1   6/2002   Erhardt et al.
6,872,610 B1   3/2005   Mansoori et al.
2005/0215055 A1   9/2005   Bu et al.
2007/0099408 A1   5/2007   Aime et al.

OTHER PUBLICATIONS

Nemouchi et al. A comparitive study of nickel silicides and nickel germanides: Phase formation and kinetics. Microelectronic Engineering 83 (Oct. 2006) 2101-2106.*

* cited by examiner

*Primary Examiner*—W. David Coleman
*Assistant Examiner*—Daniel Shook
(74) *Attorney, Agent, or Firm*—Oliff & Berridge, PLC

(57) ABSTRACT

An area made from a compound of a metallic material and semi-conducting material is produced selectively in a substrate made from semi-conducting material by previously forming a germanium oxide layer with a thickness comprised between 3 nm and 5 nm over a predefined part of a surface of the substrate and a silicon oxide layer on the rest of the surface. A metallic layer is deposited on the oxide layers. The metallic material is chosen such that its oxide is thermodynamically more stable than germanium oxide and thermodynamically less stable than silicon oxide. Thermal annealing is then performed to obtain reduction of the germanium oxide by said metallic material followed by formation of the compound, at the level of said part of the surface of the substrate. The metallic layer is then removed.

7 Claims, 5 Drawing Sheets

SELECTIVE FORMATION OF A COMPOUND COMPRISING A SEMI-CONDUCTING MATERIAL AND A METALLIC MATERIAL IN A SUBSTRATE THROUGH A GERMANIUM OXIDE LAYER

BACKGROUND OF THE INVENTION

The invention relates to a method for fabricating an electronic component.

STATE OF THE ART

In the microelectronics industry and in particular in methods involving MOS (Metal-Oxide Semiconductor) or CMOS (Complementary Metal-Oxide Semiconductor) transistors, the silicidation step, i.e. metallization of the source/drain and gate contacts is one of the most critical steps.

The most widespread technique used at present to perform this metallization is known as the "salicide" method (standing for "Self-ALIgned siliCIDE"). This technique consists, as represented in FIGS. 1 to 5, in forming a silicide called self-aligned silicide in the source, gate and drain of a silicon substrate. Thus, in FIG. 1, a silicon substrate 1 comprises, in a surface 1a:
  a gate 2 made from polycrystalline silicon arranged on an oxide layer 3
  and a source 4 and drain 5, separated from gate 2 by spacing wedges 6 also called spacers.
  Field oxides 7 further insulate source 4 and drain 5.

To perform the "salicide" process, a metallic layer 8 is deposited on the whole surface 1a of substrate 1, previously cleaned in a hydrofluoric acid (HF) solution. In FIG. 2, metallic layer 8, made for example from titanium, cobalt, nickel or platinum, thus covers the field oxide 7, source 4 and drain 5, gate 2 and spacers 6. Heat treatment is then performed at a temperature comprised between 300° C. and 500° C. in a controlled atmosphere, for example in a vacuum or a neutral gas atmosphere. This heat treatment causes a reaction between the metal of layer 8 and the underlying silicon, i.e. the silicon of gate 2 and the silicon of source 4 and drain 5. Thus, in FIG. 3, a silicon and metal compound, also called metallic silicide 9, is formed in gate 2 and in source 4 and drain 5. The areas of layer 8 in contact with field oxide 7 and spacers 6 have on the other hand not reacted during the heat treatment. These areas are then eliminated as represented in FIG. 4. Additional heat treatment or thermal annealing can then be performed if required, as represented in FIG. 5, to modify the crystalline phase of the silicide and obtain a silicide 10 having a lesser strength than the previously obtained silicide 9.

The "salicide" method thereby enables the source/drain and gate contacts to be metallized. However the silicide 10 obtained with this method presents the drawback of having the same thickness both in gate 2 and in source 4 and drain 5.

It may however be preferable to obtain a totally silicided gate 2, whereas silicide 10 in source 4 and drain 5 must on the contrary be as thin as possible to avoid junction leak problems.

Patent application US-A-2007/0099408 describes a method for obtaining silicide areas of different thicknesses, and more particularly for obtaining a totally silicided gate and a thin layer of silicide in the source and drain. The method consists in implanting antimony or aluminum in the top part of the source and drain before the metallization step so as to slow down formation of silicide and thereby limit the thickness of the silicide in the source and drain. Furthermore, during the antimony or aluminum implantation operation, the gate is covered by a protective layer preventing implantation of antimony or aluminum in the gate.

Such a method is however delicate to implement. The elements used for implantation in the source and drain are in fact limited. Only aluminum and antimony have an effect on the growth kinetics of silicides. Furthermore, the element to be implanted has to be chosen between aluminum and antimony depending on the type of transistor to be produced. A PMOS transistor requires the use of aluminum whereas an nMOS transistor requires the use of antimony. Moreover, the quantity of aluminum or antimony to be implanted is a maximum of $5*10^{15}$ atoms/cm$^3$.

OBJECT OF THE INVENTION

The object of the invention is to provide a method for fabricating an electronic component enabling the above-mentioned shortcomings to be remedied.

According to the invention, this object is achieved by the appended claims and particularly the fact that the method comprises at least one step of selective formation of at least one area made from a compound comprising a semi-conducting material and a metallic material in a substrate made from semi-conducting material, said step comprising at least successively:
  formation of a germanium oxide layer with a thickness comprised between 3 nm and 5 nm on a part of a surface of the substrate and of a silicon oxide layer on the rest of said surface,
  deposition, on the oxide layers, of a layer formed by a metallic material whose oxide is thermodynamically more stable than germanium oxide and less stable than silicon oxide,
  thermal annealing at a preset temperature to obtain reduction of the germanium oxide by said metallic material followed by formation of said area, at the level of said part of the surface of the substrate,
  and removal of the layer of metallic material.

According to a development of the invention, the semi-conducting material is chosen from silicon, germanium or a silicon and germanium alloy.

According to a preferred embodiment, a transistor comprising a gate, source and drain being formed in the substrate, selective formation of said area is achieved in the transistor gate. Moreover, removal of the layer of metallic material is advantageously followed by a step of deoxidizing the gate, source and drain, and the step of selective formation of said area in the gate is more particularly followed by a step of non-selective formation of said compound in the source, drain and gate. This enables a gate totally formed by said compound to be obtained, and more particularly enables a totally silicided gate (i.e. made of metallic silicide) to be obtained in the case of a silicon substrate or made of metallic germanide in the case of a germanium substrate.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

To obtain a silicide in gate 2 with a larger thickness than that of the silicide present in source 4 and drain 5, a particular embodiment of the invention represented schematically in FIGS. 6 to 13 proposes another path than that proposed in Patent application US-A-2007/0099408.

This path consists in previously selectively forming a first layer of silicide of predefined thickness e1 in gate 2 only, and in then performing a conventional "salicide" process. The "salicide" process then enables a second silicide layer of predefined thickness e2 to be formed in both source 4 and drain 5 and in gate 2. Thus, in gate 2, the second silicide layer of thickness e2 completes the first silicide layer of thickness e1. The silicide formation conditions can advantageously be chosen to obtain a totally silicided gate 2, i.e. a silicide whose total thickness, i.e. the sum of thicknesses e1 and e2, corresponds to the total consumption of the initial gate 2 of initial thickness E. Complete metallization of a silicon layer does in fact result in a metallic silicide layer having a larger thickness than that of the initial silicon layer, as the densities and therefore the crystalline structures of metallic silicide and silicon are different. Thus, for example purposes, complete metallization of a 1.81 nm layer of silicon by a "salicide" method using a layer of nickel with a thickness of 1 nm enables a thin layer of silicide NiSi of 2.18 nm to be obtained.

Figure 1:
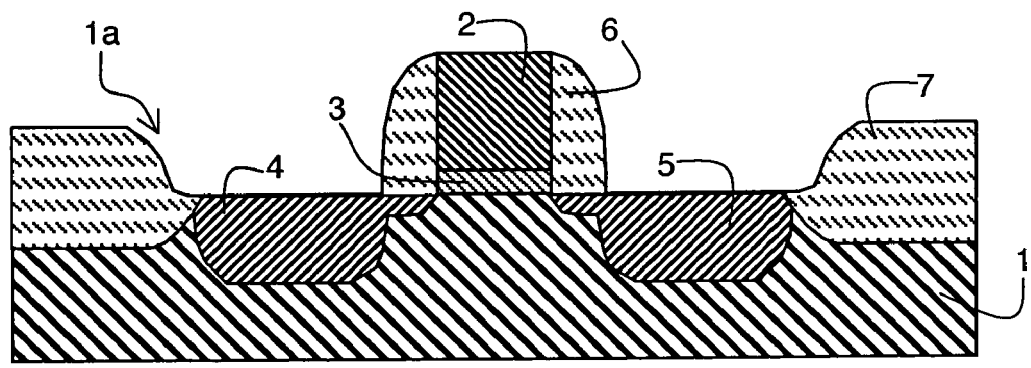
FIGS. 1 to 5 schematically represent in cross-section different steps of formation of a silicide in a transistor according to the prior art.
Figure 2:
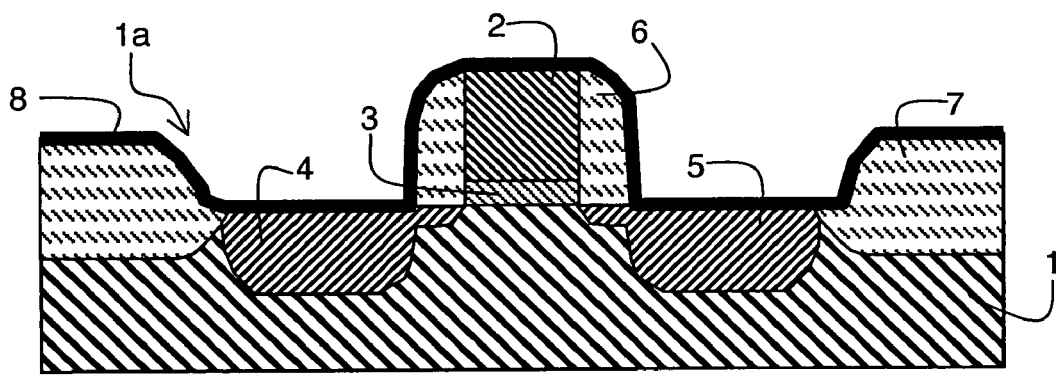
Figure 3:
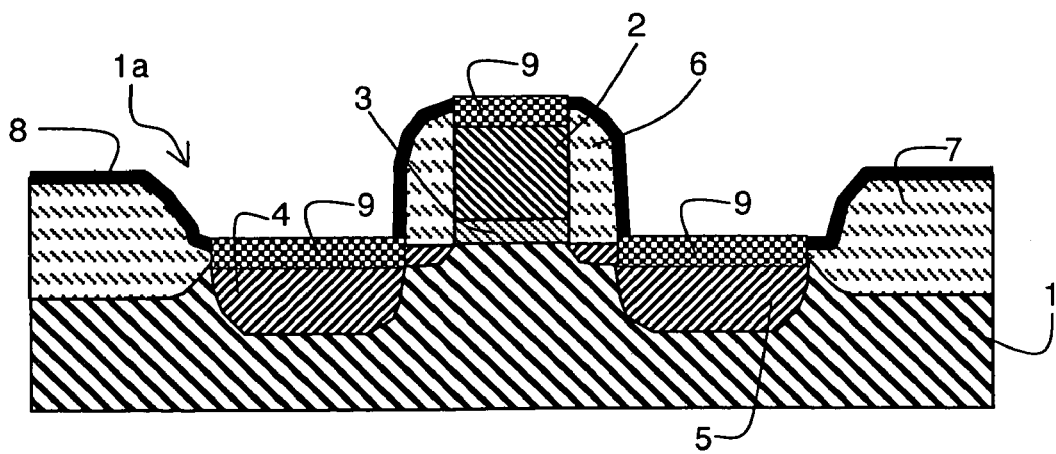
Figure 4:
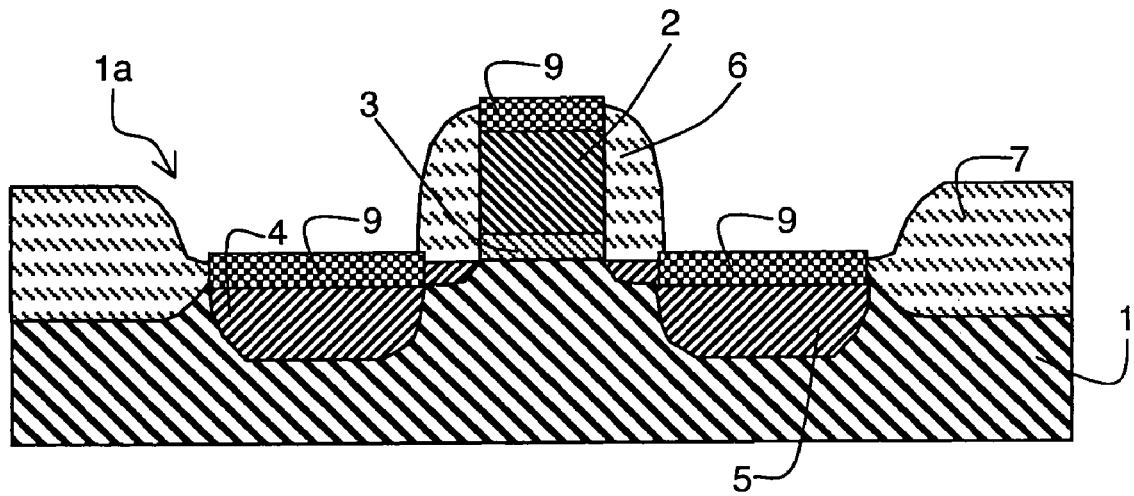
Figure 5:
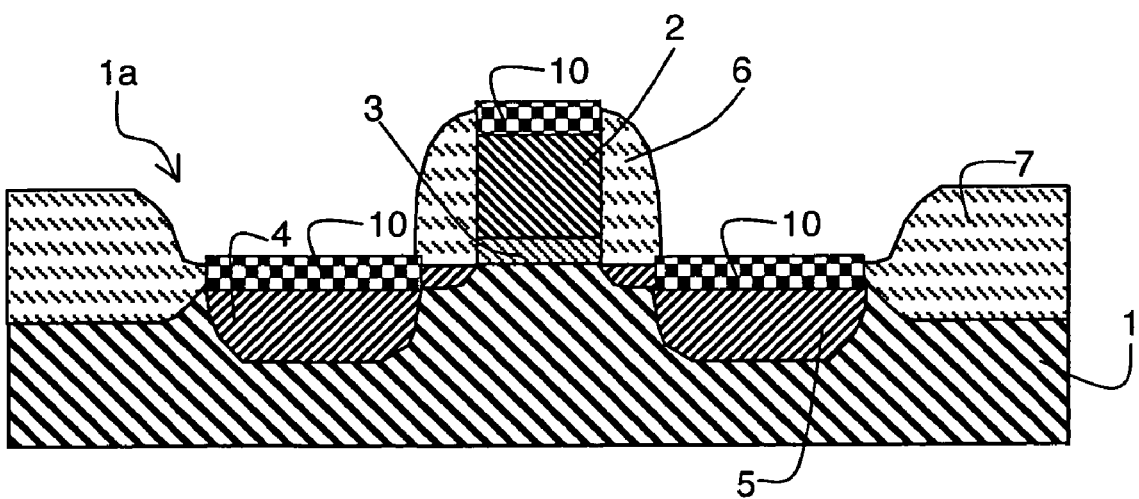
Figure 6:
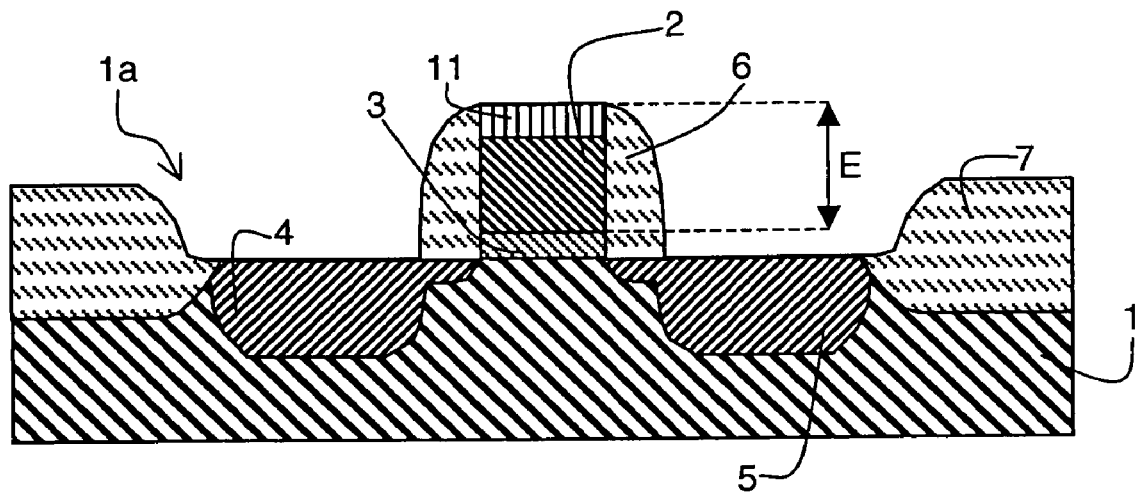
FIGS. 6 to 13 schematically represent in cross-section different steps of formation of a silicide in a transistor according to the invention.

To perform the selective formation step of the silicide in gate 2 and as represented in FIG. 6, a germanium layer 11 is formed on the free surface of gate 2 and is surrounded by spacing wedges 6. Germanium layer 11 is in particular produced during formation of gate 2, before spacing wedges 6, source 4 and drain 5 are produced. Thus, an oxide layer, a polycrystalline silicon layer and a germanium layer are successively arranged on the whole of the free surface of substrate 1 (full-wafer deposition). All the layers are then lithographed and etched to form the gate and therefore to keep the gate stack only (3, 2 and 11 in FIG. 6). The thickness of germanium layer 11 arranged on gate 2 is advantageously comprised between 4 nm and 10 nm.

Figure 7:
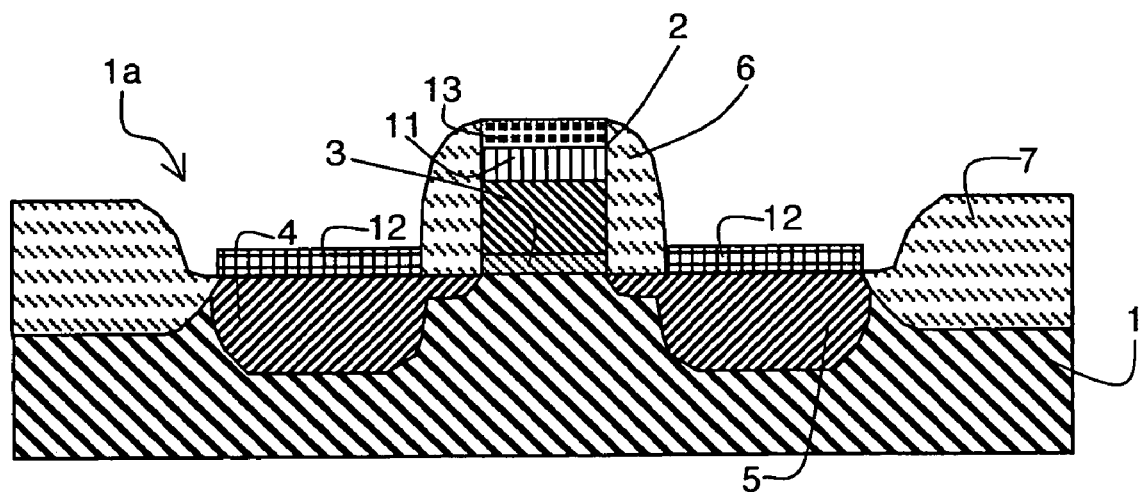

The whole of surface 1a of substrate 1 is then oxidized, for example by thermal oxidation. Thus, in FIG. 7, source 4 and drain 5 are covered by a layer of silicon oxide 12, whereas a layer of germanium oxide 13 having a thickness comprised between 3 nm and 5 nm covers gate 2. Oxidation of germanium layer 11 may be partial or total. A part of germanium layer 11 not having been oxidized can thereby, as represented in FIG. 7, be arranged between germanium oxide layer 13 and gate 2. In an alternative embodiment, if the whole of the germanium layer 11 has been oxidized, germanium oxide layer 13 is directly in contact with gate 2. In this case, the conditions of the oxidation step must however be controlled so that the silicon of gate 2 does not oxidize.

Figure 8:
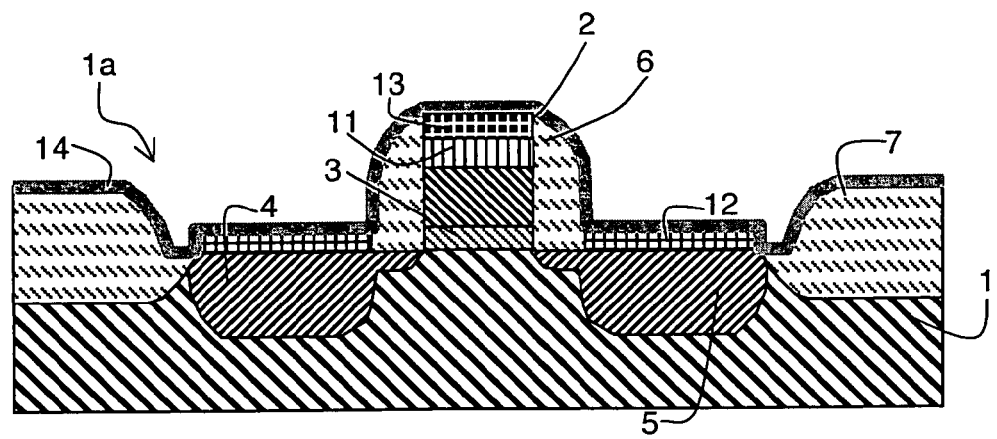

A metallic layer 14 is then deposited on the whole surface 1a of substrate 1. In FIG. 8, metallic layer 14 thus covers field oxides 7, silicon oxide 12 formed on source 4 and drain 5, germanium oxide 13 and spacers 6.

The material forming said metallic layer 14 is chosen in predetermined manner, advantageously from a metal or a metal alloy.

The metallic material forming said layer 14 is chosen such that, once the metallic material has oxidized, the corresponding metal oxide formed is thermodynamically more stable than germanium oxide 13 and thermodynamically less stable than silicon oxide 12. Thus, in a given temperature range, germanium oxide will be reduced by the metallic material of layer 14 so as to obtain the corresponding metal oxide whereas silicon oxide will not be reduced by the metallic material.

Moreover, the choice of material constituting metallic layer 14 can be determined according to the underlying semi-conducting material, i.e. the semi-conducting material of gate 2, with which the metallic material has to react, but also according to the electric and thermo-kinetic properties of the compound made from material metallic and from the semi-conducting material thus formed. Thus, in the embodiment represented in FIGS. 6 to 13, gate 2 being made of silicon, the metallic material forming metallic layer 14 is chosen such as to react with said silicon to form a silicide. For a germanium gate, the metallic material of metallic layer 14 is chosen such as to form a metallic germanide, i.e. a preferably defined compound of germanium and of said material.

Advantageously, the material constituting metallic layer 14 can be chosen from chromium, cobalt, nickel, copper, a nickel-platinum alloy (also noted Ni(Pt)) or a nickel-titanium alloy (also noted Ni(Ti)), according to the semi-conducting material forming gate 2. Thus, for a silicon or germanium gate, all of the materials cited above can be used to form metallic layer 14 whereas for a SiGe gate, the material is preferably chosen from copper, Ni(Pt)) or Ni(Ti).

Thermal annealing or treatment is then performed at a preset temperature to cause the following chain reactions at the level of gate 2:

(i) reduction of germanium oxide 13 by the material of metallic layer 14, (ii) and formation of a compound preferably a defined compound between the material of metallic layer 14 and the underlying semi-conducting material by reactive diffusion through the metal oxide obtained during the reduction reaction in (i).

More precisely, thermal annealing is advantageously performed between 300° C. and 800° C., depending on the material used for metallic layer 14. For example, for a metallic layer 14 made of nickel or chromium, the annealing temperature is advantageously about 350° C. whereas the annealing temperature is preferably about 600° C. for a metallic layer 14 made of cobalt and about 700° C. for a metallic layer 14 made of copper. Furthermore, the thickness of metallic layer 14 deposited prior to thermal annealing is advantageously larger than a preset thickness corresponding to the minimum thickness necessary to totally reduce germanium oxide 13 during said annealing. The thickness of metallic layer 14 is more particularly determined by thickness e1 required for the compound (for example silicide or germanide) formed in gate 2.

Figure 9:
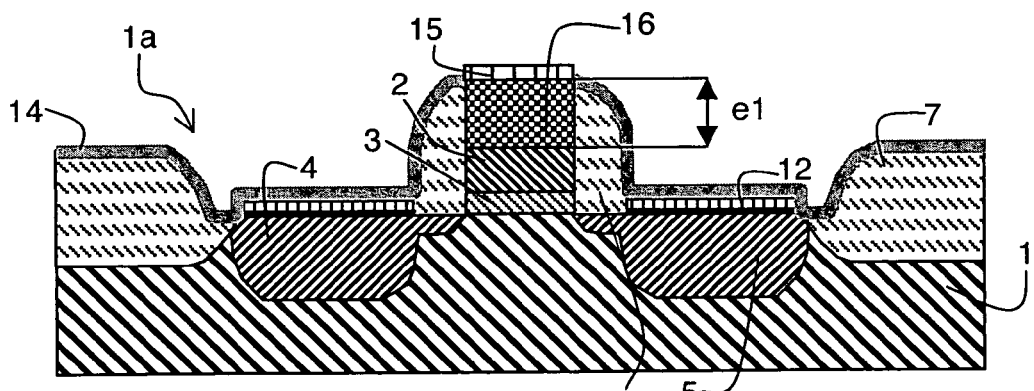

Thus, in the example represented in FIGS. 6 to 13, during thermal annealing, the material of metallic layer 14 reduces germanium oxide 13, at the level of gate 2, to form a metal oxide that then reacts with the silicon of gate 2 to form a silicide 16 of preset thickness e1. In FIG. 9, the metal oxide has not totally reacted with the silicon of gate 2, so that silicide 16 formed in gate 2 is still covered by a resulting thin layer of metal oxide 15. On the other hand, as silicon oxide 12 arranged on source 4 and drain 5 is thermodynamically more stable than said metal oxide, the material of metallic layer 14 does not reduce silicon oxide 12 during thermal annealing. Source 4 and drain 5 are therefore not silicided during thermal annealing as the silicon oxide inhibits the reaction between the material of metallic layer 14 and the silicon at the level of source 4 and drain 5. Thus in FIG. 9, only the part of layer 14 arranged on gate 2 has been consumed during thermal annealing and the rest of surface 1a of the substrate is still covered by layer 14.

Figure 10:
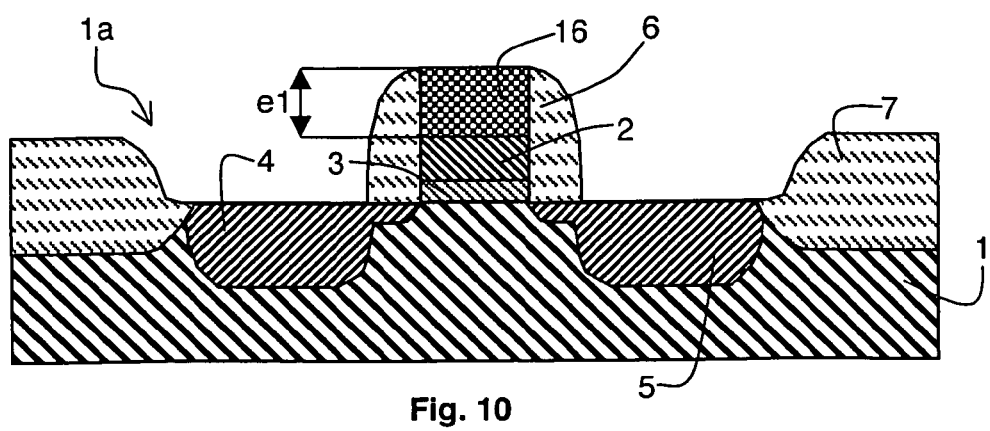
Figure 11:
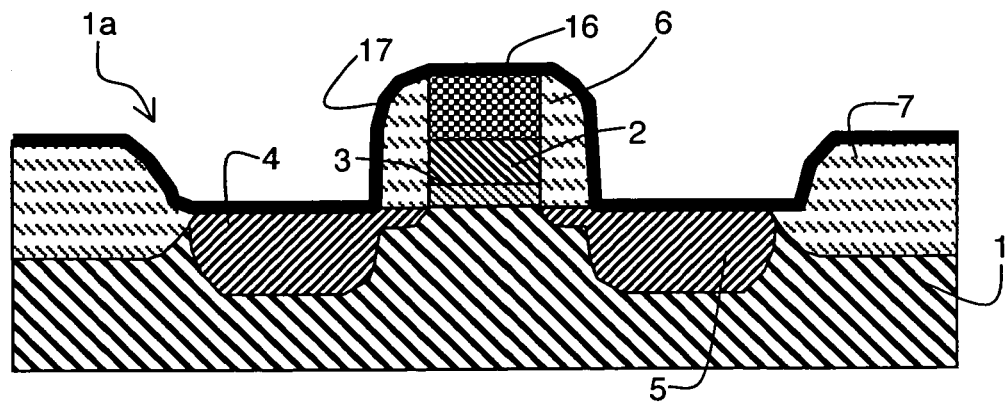
Figure 12:
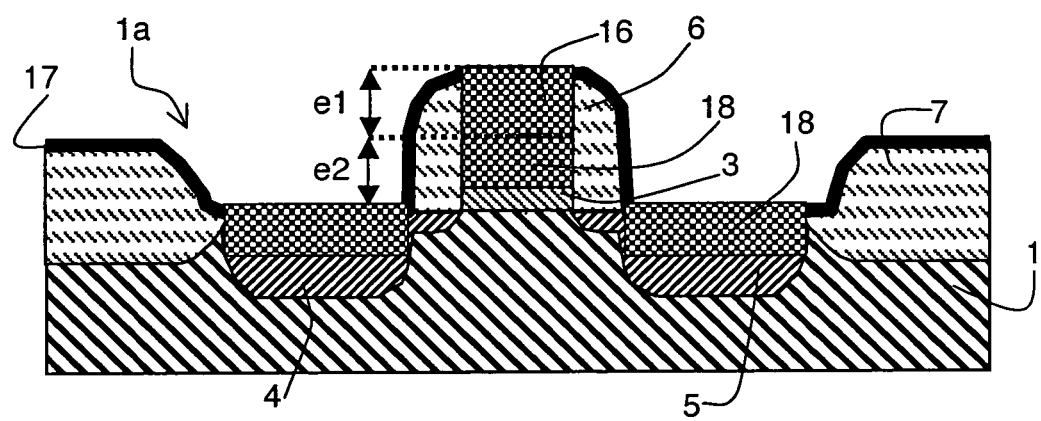

As represented in FIG. 10, the remaining parts of layer 14, arranged on silicon oxide 12, are then removed and surface 1a of substrate 1 is deoxidized to eliminate the resulting metal oxide 15 and release the surface of gate 2, partly silicided over a thickness e1.

The use of a germanium oxide as sacrificial layer at the level of gate 2 whereas the rest of substrate 1 is covered by silicon oxide enables a silicide to be selectively formed in said gate 2, due to the particular choice of the material used to form layer 14, whereas drain 5 and source 4 are protected by silicon oxide 12.

Figure 13:
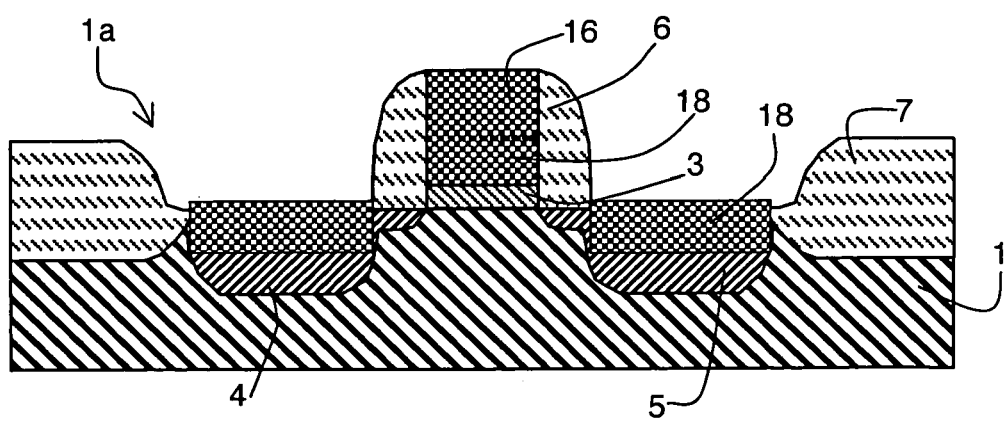

A conventional salicide method can then be advantageously performed on substrate 1 represented in FIG. 10 to form a silicide in non-selective manner in source 4, drain 5 and gate 2. For this, a metallic layer 17 is deposited on surface 1a of substrate 1 (FIG. 11), then thermal annealing is performed so as to form a silicide layer 18 in gate 2, source 4 and drain 5 in conventional manner. The material forming layer 17 can be identical or not to that constituting layer 14. Furthermore, the thermal annealing conditions are determined so as to obtain a silicide of preset thickness e2 corresponding to the required silicide thickness in source 4 and drain 5. Metallic layer 17 is then removed (FIG. 13) and a second thermal annealing can be performed if required, as in the prior art, to modify the phase of the obtained silicide. In FIG. 13, gate 2 is thus totally silicided and source 4 and drain 5 both comprise a sufficiently thin silicide layer to prevent junction leak problems.

The different steps represented in FIGS. 6 to 10 for the particular embodiment described above can be used in a more general manner to produce an electronic component, and in particular to selectively form an area made from a compound preferably a defined compound comprising a metallic material and the semi-conducting material forming said substrate, in a substrate made from semi-conducting material. The compound is thus a silicide in the case of a silicon substrate and a germanide in the case of a germanium substrate. Selective formation of such an area is obtained by previously forming:

a germanium oxide layer with a thickness comprised between 3 nm and 5 nm on a predefined part of a surface of said substrate and a silicon oxide layer on the rest of the surface.

Then a layer formed by a metallic material chosen in predetermined manner is deposited on the oxide layers. As before, the metallic material is advantageously chosen not only according to the type of semi-conducting material arranged under the germanium oxide layer, but also in such a way that its oxide is thermodynamically more stable than germanium oxide and thermodynamically less stable than silicon oxide. Thermal annealing is then performed to obtain reduction of the germanium oxide by the metallic material followed by formation of the compound, at the level of said part of the substrate surface. The metallic layer is then removed.

The selective and localized nature of the area formed by the compound is thereby obtained by means of the following two properties: within a given temperature range, the metallic material and the semi-conducting material react in the presence of germanium oxide, whereas no reaction takes place though silicon oxide. As a general rule, all the metals whose oxide is more stable in a given temperature range (corresponding to the thermal annealing temperature range) than that of germanium and less stable than that of silicon can be used in the scope of the invention. Furthermore, all semi-conducting materials are usable provided that:

the semi-conducting material can react with the metallic material to form a compound and in particular a defined compound.

silicon and germanium, used to form the silicon oxide and germanium oxide layers, can be deposited on the semi-conducting material forming the substrate.

The invention claimed is:

1. A method for fabricating an electronic component, comprising at least one step of selective formation of at least one area made from a compound comprising a semi-conducting material and a metallic material in a substrate made from semi-conducting material, said step comprising at least successively:

forming a germanium oxide layer of a thickness comprised between 3 nm and 5 nm on a part of a surface of the substrate and a silicon oxide layer on the rest of said surface, depositing, on the oxide layers, a layer formed by a metallic material whose oxide is thermodynamically more stable than germanium oxide and less stable than silicon oxide, thermal annealing at a preset temperature to obtain reduction of the germanium oxide by said metallic material followed by formation of said area, at the level of said part of the surface of the substrate, and removing the layer of metallic material.

2. The method according to claim 1, wherein the semi-conducting material is chosen from silicon, germanium or a silicon and germanium alloy.

3. The method according to claim 1, wherein the metallic material is chosen from chromium, cobalt, nickel, copper, nickel-platinum alloy and nickel-titanium alloy.

4. The method according to claim 1, wherein the temperature of the thermal annealing is comprised between 300° C. and 800° C.

5. The method according to claim 1, wherein a transistor comprising a gate, source and drain being formed in the substrate, selective formating of said area is performed in the gate of the transistor.

6. The method according to claim 5, wherein removing the metallic material layer is followed by a step of deoxidization of the gate, source and drain.

7. The method according to claim 6, wherein the step of selective formation of said area in the gate is followed by a step of non-selective formation of said compound in the source, drain and gate.

* * * * *